United States Patent
Kulhalli et al.

(10) Patent No.: US 6,400,301 B1
(45) Date of Patent: Jun. 4, 2002

(54) AMPLIFYING SIGNALS IN SWITCHED CAPACITOR ENVIRONMENTS

(75) Inventors: Suhas R. Kulhalli; Visvesvaraya A. Pentakota, both of Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/826,496

(22) Filed: Apr. 3, 2001

Related U.S. Application Data (60) Provisional application No. 60/230,954, filed on Sep. 7, 2000.

(51) Int. Cl.[7] .................................................. H03M 1/06
(52) U.S. Cl. ....................................................... 341/155
(58) Field of Search ................................ 341/118, 120, 341/155, 172, 161

(56) References Cited

U.S. PATENT DOCUMENTS 6,140,948 A * 10/2000 Yu .............................. 341/118

OTHER PUBLICATIONS

Paul C. Yu & Hae–Seung Lee, "A 2.5 V, 12–b, 5–M Sample/s Pipelined CMOS ADC", IEEE Journal of Solid–State circuits, vol. 31, No. 12, Dec. 1996.

* cited by examiner

*Primary Examiner*—Brian Young
(74) *Attorney, Agent, or Firm*—J. Dennis Moore; W. James Brady, III; Frederick J. Telecky, Jr.

(57) ABSTRACT

An amplification circuit sharing a main amplifier in two gain stages while minimizing power consumption. A Miller Compensated Amplifier contains the main amplifier and a pre-amplifier, with the output of the pre-amplifier being connected to the input of the main amplifier. In a first gain stage, the two amplifiers together amplify an input signal. The main amplifier is then disconnected from the pre-amplifier in a second gain stage to further amplify the amplified signal of the first gain stage. A capacitor is configured to act as a compensation capacitor of the main amplifier in the first gain stage, and as a sampling capacitor in the second gain stage. The amplifier circuit may be implemented in an ADC of a digital camera.

34 Claims, 4 Drawing Sheets

AMPLIFYING SIGNALS IN SWITCHED CAPACITOR ENVIRONMENTS

RELATED APPLICATION(S)

The present application is related to and claims priority from the U.S. Provisional Patent Application Ser. No. 60/230,954, entitled, "A Method for Amplifier Sharing in Switched Capacitor Applications", filed on Sep. 7, 2000, and is incorporated in its entirety herewith.

BACKGROUND OF THE INVENTION

1. Field of the Invention

The present invention relates to integrated circuit design, and more specifically to a method and apparatus for amplifying signals in switched capacitor environments.

2. Related Art

Gain stages are often employed to amplify signals. In general, a gain stage amplifies an input signal to generate an amplified output signal. Examples of places where gain stages are employed include, but not limited to, Programmable Gain Amplifiers (PGAs), Analog to Digital Converters (ADCs).

Gain stages are often implemented in switched capacitor environments. A typical switched capacitor environment contains amplifier(s), switches and capacitors driven by clock signals. A capacitor may be used to sample (charged using) an input voltage signal in one phase ("sampling phase") of a clock signal.

The sampled signal may be amplified in another phase ("hold or amplify phase") of the clock signal by a combination of the capacitors and the amplifier to generate an amplified signal. The amplification factor of the gain stage generally depends on the capacitance values and configuration of the capacitors used with the amplifier. The switches and the clock signals are designed to place the other components of the gain stage in the two phases.

One typical requirement in the implementation of gain stages is the reduction of consumption of electrical power, preferably without degrading of the performance parameters such as bandwidth (i.e., speed with which the signal is amplified), distortion and noise. Therefore, what is needed is a method and apparatus which enable signals to be amplified to a desired degree while minimizing power consumption without potentially degrading the other performance parameters.

SUMMARY OF THE INVENTION

An embodiment of an amplification circuit of the present invention is implemented in the context of a Miller Compensated Amplifier which contains two amplifiers, referred to as a pre-amplifier and a main-amplifier. The output of the pre-amplifier drives the input of the main-amplifier. Capacitors are placed across the main-amplifier for stability and are referred to as compensation capacitors. A feedback capacitor may connect the output of the main amplifier to the input of the pre-amplifier.

According to an aspect of the invention, the two amplifiers together operate to amplify an input signal in one phase ("first phase") of a clock signal. In another clock phase ("second phase"), the main-amplifier is de-coupled from the pre-amplifier and reused as an independent amplifier to further amplify the signal generated in the first phase.

To achieve such decoupling, two H-switches, which are closed in the first phase and open in the second phase, may be used. The first H-switch may be connected between the output of the pre-amplifier and the input of the main amplifier. The second H-switch may be connected between the output of the main amplifier and the feedback capacitor. By opening the two H-switches, the decoupling may be achieved.

The above amplification circuit may be viewed logically as implementing two gain stages operating in series. That is, the configuration of the circuit in the first phase may be viewed as one gain stage and the configuration of the circuit in the second stage may be viewed as another gain stage. The second gain stage amplifies the amplified output generated by the first stage as described below in further detail.

Another aspect of the present invention enables further amplification in the second gain stage by merely decoupling at least one of the compensation capacitors ("second compensation capacitor") from the output of the main amplifier. To enable such a feature, a third H-switch may be to used to connect the second compensation capacitor to the output of the main amplifier in the first phase and to de-couple from the output during the second phase. In effect, the amplified signal of the first stage may be sampled onto compensation capacitors in the first phase, and the decoupling enables the signal to be further amplified assuming other compensation capacitors are present for the main amplifier.

In addition, both the capacitors may respectively be coupled to a respective constant voltage during the second phase by a respective S-switch. In general, S-switches are used to provide amplification during the second phase and disconnect in the first stage. Thus, a gain stage may contain an additional S-switch ("first S-switch") which enables an input signal to be sampled on the sampling capacitor in the second phase and causes the input signal to be de-coupled from the input signal during the first phase.

In operation, when the first S-switch is closed, an input signal is sampled by the sampling capacitor. When the H-switches are closed and S-switches open in the first phase, the sampled signal is amplified. The amplified signal is sampled on the compensation capacitors as well. The two compensation capacitors operate as compensation capacitors for the main amplifier as well as sampling capacitors for the next phase. When the S-switches are closed and the H-switches open, the second compensation capacitor is disconnected from the output of the main amplifier and further amplifies the amplified signal generated in the first stage.

In one embodiment, the ratio of the feedback capacitance to the sampling capacitor designed to equal 8, and an amplification of 8 may accordingly be attained. The capacitance of the first compensation capacitor may be chosen to equal the capacitance of the second compensation capacitor, with the result that the gain of the second amplification stage equals 2. As the amplified output of the first stage is provided as an input to the second stage, an effective amplification of 16 may be attained.

An amplification circuit operating as described above may consume minimal power since the first amplifier drives low load (only the compensation capacitors) when a high amplification is being attained (8 in the above embodiment) and the main-amplifier drives a high load, while a low gain is attained. As the main amplifier may be used during both the phases, the wastage of electrical power is reduced.

In one embodiment, the input signal is received as a differential signal. An aspect of the present invention enables the common mode voltages of the two amplifier to be set independently. In one embodiment which facilitates such a feature, the pre-amplifier may contain a first p-mosFET and a second p-mosFET, with the source terminals being connected to a supply voltage AVDD. The gate terminals of the first p-mosFET and the second p-mosFET may be biased by a common signal.

The pre-amplifier may further contain a third n-mosFET and a fourth n-mosFET, with the source terminal of the third n-mosFET being connected to the drain terminal of the fourth n-mosFET. The source of the fourth n-mosFET is grounded. The drain terminal of the third n-mosFET may be connected to the drain terminal of the first p-mosFET. This also forms one output terminal of the pre-amplifier. The pre-amplifier may also contain a fifth n-mosFET and a sixth n-mosFET, with the source terminal of the fifth n-mosFET being connected to the drain terminal of the sixth n-mosFET and the source of the sixth n-mosFET is grounded. The drain terminal of the fifth n-mosFET may be connected to the drain terminal of the second p-mosFET. This forms the second output terminal of the pre-amplifier.

The gate terminal of the fourth n-mosFET and sixth n-mosFET may be connected to the first and second output terminal of the pre-amplifier. By sizing the n-mosFET's appropriately, the common mode voltage (average voltage of the first and second output terminal of the pre-amplifier) can be achieved as desired. Thus the common mode voltage of the pre-amplifier can be made equal to the required input common mode voltage of the main-amplifier. This allows for direct cascading between the pre-amplifier and main-amplifier. Direct cascading generally leads to lower power consumption as additional components do not add to the load, as well as better performance due to reduced complexity.

The above-described amplification circuit may be used in several environments. In one embodiment, the amplification circuit is implemented in an analog to digital circuit (ADC), which in turn is implemented in an analog front end (AFE) of a digital camera. The ADC receives voltage signals representing the charges in a charge coupled device, and converts the charges into digital values. The digital values together represent an image frame.

Further features and advantages of the invention, as well as the structure and operation of various embodiments of the invention, are described in detail below with reference to the accompanying drawings. In the drawings, like reference numbers generally indicate identical, functionally similar, and/or structurally similar elements. The drawing in which an element first appears is indicated by the leftmost digit(s) in the corresponding reference number.

BRIEF DESCRIPTION OF THE DRAWINGS

The present invention will be described with reference to the accompanying drawings, wherein.

DETAILED DESCRIPTION OF THE PREFERRED EMBODIMENTS

1. Overview and Discussion of the Invention

The present invention allows an amplification circuit to be implemented while reducing electrical power consumption. The reduction is achieved by using a main amplifier and a pre-amplifier, with the main amplifier being used along with the pre-amplifier to amplify an input signal in one phase of a clock signal. In a second phase, the amplified signal is further amplified merely using the main amplifier. As the main amplifier is used during both the phases and as the product of load driven and amplification in the two phases is kept low, the power consumption is reduced.

One more aspect of the present invention allows the two amplifiers to operate using differential inputs and output, and be cascaded without any intermediate capacitors. The absence of intermediate components leads to further reduction in power consumption as the load driven by the amplifiers is reduced.

Several aspects of the invention are described below with reference to example environment(s) for illustration. It should be understood that numerous specific details, relationships, and methods are set forth to provide a full understanding of the invention. One skilled in the relevant art, however, will readily recognize that the invention can be practiced without one or more of the specific details, with other methods, and/or in other environments etc. In other instances, well-known structures or operations are not shown in detail to avoid obscuring the invention.

2. Example Environment

Figure 1:
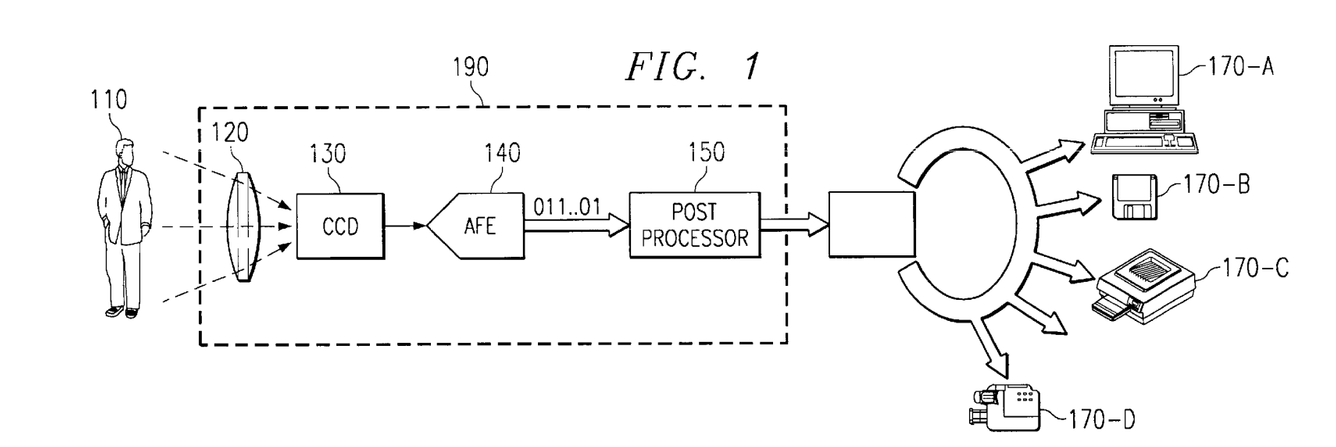
FIG. 1 is a block diagram illustrating an example environment in which the present invention can be implemented.

FIG. 1 is a block diagram illustrating an example environment in which the present invention can be implemented. There is shown the light from image 110 being allowed pass through device 190 (such as a digital camera or a scanner). The output of device can be used for further processing, printing or storing, etc., as described below in further detail.

With respect to device 190, the light from image 110 is shown being focused on CCD 130 by lens 120. CCD 130 contains several pixels which are charged proportionate to the product of the incident light intensity and the time of exposure to the light. The charge is converted into voltage in a known way and transferred to analog front-end (AFE) 140. CCD 130 is an example embodiment of an image sensor.

AFE 140 may employ techniques such as correlated double sampling (which are well known in the relevant arts) to generate a voltage level corresponding to each pixel processed by AFE 140. AFE 140 may then sample the voltages to generate the digital values representing the image. Several aspects of the present invention enable AFE 140 to be implemented while minimizing the electrical power consumption as described below with examples in further detail.

Post processor 150 processes the digital values generated by AFE 140, generally to enhance the quality of image represented by the digital values and/or to convert the data into suitable format for storing. The resulting output data may be used in several ways, for example, viewed/edited by computer system 170-A, stored in floppy disk 170-B, printed on a printer 170-C or transferred to video player 170-D.

The description is continued with reference to AFE 140 which converts voltages into digital values while minimizing power consumption in accordance with several aspects of the present invention.

3. Analog Front End (AFE)

Figure 2:
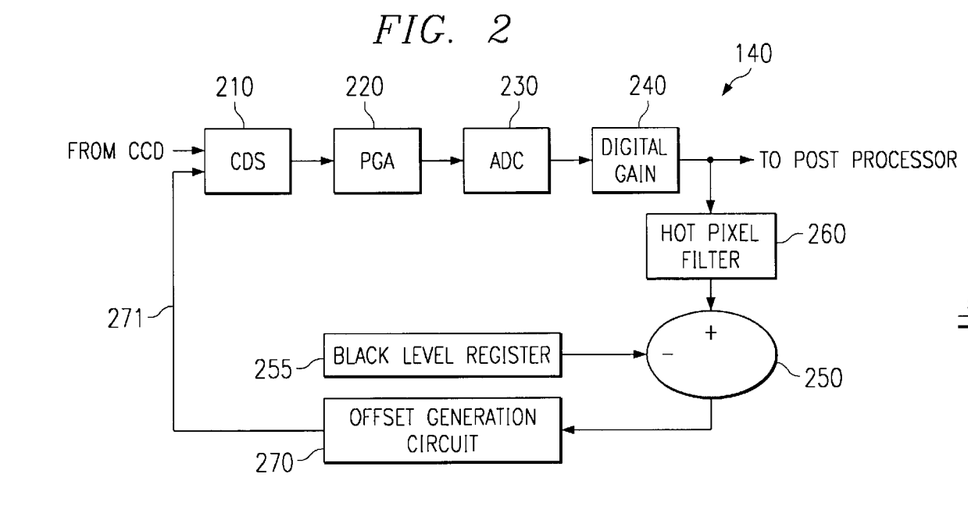
FIG. 2 is a block diagram illustrating the details of an embodiment of an analog front end provided in accordance with the present invention.

FIG. 2 is a block diagram of AFE 140 illustrating the details (in one embodiment) as relevant to an understanding of several aspects of the present invention. AFE 140 is shown containing correlated double sampler circuit (CDS) 210, programmable gain amplifier (PGA) 220, analog to digital converter (ADC) 230, digital gain 240, adder 250, black level register 255, hot pixel filter 260, offset generation circuit 270. Each component is described below in further detail.

CDS 210 receives voltage inputs from CCD 130, and performs a correlated double sampling operation. In addition, CDS 210 performs offset correction by subtracting (in analog domain) the offset received from offset generation circuit 270 from each of the pixel analog values. The voltage output of CCD 210 is amplified by PGA 220 by a gain specified typically by a designer depending on image 110. CDS 210 and PGA 220 may be implemented in a known way.

ADC 230 digitizes the amplified voltage signal to generate pixel digital elements. ADC 230 may contain several amplifiers implemented in accordance with the present invention as described below in further detail with reference to example embodiments. The pixel digital elements may again be amplified by digital gain 240, which may be implemented in a known way.

Hot pixel filter 260 may ignore 'hot pixels' (which are stuck at a high value due to, for example, manufacturing defects). In an embodiment, a value corresponding to an adjacent pixel may be substituted for each hot pixel. Adder 250 subtracts the black level value stored in black level register 255 from each pixel digital element received from digital gain 240. As is well known in the relevant arts, a designer may wish to set black/dark level to a non-zero value, and the corresponding value is subtracted from each pixel digital value.

Offset generation circuit 270 generates an offset on path 271 based on the digital values corresponding to the dark pixels received from CCD 130. The offset may be generated, for example, as described in co-pending commonly assigned patent application Ser. No. 09/747,325 entitled, "Improved Offset Correction of the Output of a Charge Coupled Device", naming as inventors Kulhalli et al, filed on Dec. 21, 2000, which is incorporated in its entirety herewith.

The description is continued with reference to an example implementation of ADC 230 which may generate a 14-bit output at a rate of 21 Mega-samples/second. As will be clear from the description, the embodiment is provided while minimizing electrical power consumption.

4. Analog to Digital Converter (ADC)

Figure 3:
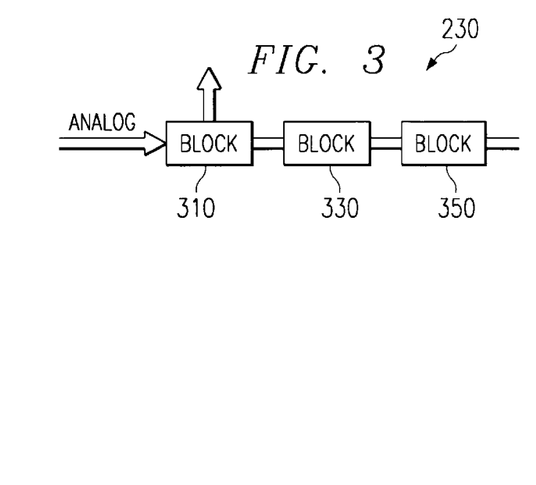
FIG. 3 is a block diagram illustrating the details of an embodiment of a pipelined analog to digital converter (ADC) in accordance with the present invention.

FIG. 3 is a block diagram illustrating the details of ADC 230 in one embodiment of the present invention. ADC 230 is shown containing three blocks 310, 330, and 350. The three blocks are respectively designed to generate (or resolve) 5, 5, and 6 bits. Two of the fourteen bits may be redundant and used to correct errors in resolution of the more significant bits in a known way. The correction circuit is not shown and described as not being necessary to understand the described embodiments.

Figure 4A:
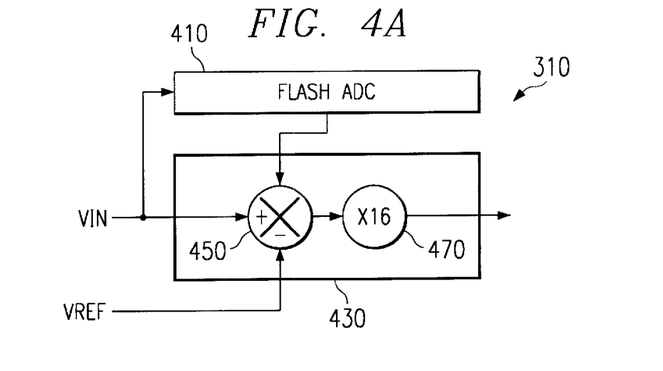
FIG. 4A is a block diagram illustrating the details of one embodiment of a block used in an ADC.
Figure 4B:
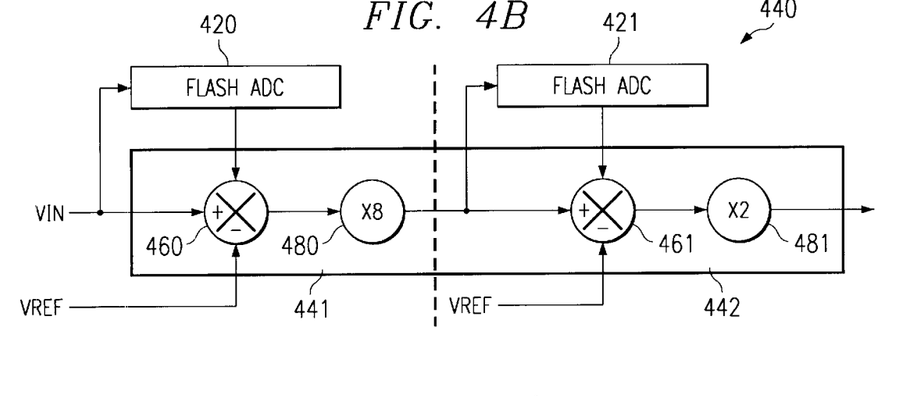
FIG. 4B is a block diagram illustrating the details of another embodiment of a block used in an ADC.

The three blocks are described with reference to block 310 for conciseness. However, the description may be applicable to other blocks as well. FIGS. 4A and 4B are block diagrams illustrating example implementation of block 310. Each implementation is described briefly first and the advantages of FIG. 4B are noted then.

With reference to FIG. 4A, flash analog to digital converter (ADC) 410 resolves a subset of the bits generated by ADC 230 by examining the input signal Vin. Typically, a reference signal Vref is divided into a number of voltage levels, and the input signal Vin is compared to each divided level. The highest divided level exceeding the Vin signal generally determines the resolved value (or bits). Flash ADC 410 may be implemented in a known way.

Adder/subtractor 450 and gain stage 470 may conveniently be integrated into one integrated circuit 430. Adder/subtractor 450 receives the resolved value (bits) from flash ADC 410, a reference signal Vref and input signal Vin, and generates a residue analog signal representing the unresolved portion of the input signal Vin. The analog residue signal (Vres) may mathematically be represented by the equation:

$$V\text{res} = V\text{in} - (\text{Value/Maximum levels}) \times V\text{ref} \qquad \text{Equation (1)}$$

Wherein 'x' represents multiplication operation, 'Value' represents the value of the resolved bits, Vin represents the input voltage, Vres represents the residue voltage, and Maximum levels represents the total number of divisions of the reference signal.

Gain stage 470 amplifies the analog residue signal by a factor of $2^{**}n$, wherein 'n' generally represents the number of bits resolved by flash ADC 410. Typically, n is less than the number of bits resolved by the flash ADC 410. As an illustration, for n=4, number of bits resolved by flash ADC 410 may equal 5. The extra bits resolved are for redundancy and is required to reduce the constraint on the flash accuracy 410 as is well understood in the relevant arts. Thus, the output of gain stage block 430 may be given by the following equation:

$$V\text{out} = V\text{res} \times 2^{**}n \qquad \text{Equation (2)}$$

Substituting Equation 1 in Equation 2 the following equation is obtained $$V\text{out} = (V\text{in} - (\text{Value/Maximum levels}) \times V\text{ref}) \times 2^{**}n$$

i.e., $$V\text{out} = [V\text{in} \times 2^{}n] - [(\text{Value/Maximum levels}) \times V\text{ref} \times 2^{}n] \qquad \text{Equation(b 3)}$$

The Vout signal generated by one block is provided as an input to the next block. Due the amplification, all the blocks may operate in a similar voltage range. All the bits may thus be resolved.

Continuing with reference FIG. 4B, block 330 is shown containing two sub-blocks 441 and 442, and flash ADCs 420 and 421 (also commonly referred to as sub-ADCs). Each of the sub-blocks may be used as an independent block of FIG.

3. Sub-block 441 is shown containing adder/subtractor 460 and gain stage 480, and sub-block 442 is shown containing adder/subtractor 461 and gain stage 481.

An aspect of the present invention allows gain stages 480 and 481 to be conveniently integrated into one amplification circuit 440. Adder subtractors 460 and 461 may also be integrated conveniently into the amplification circuit 440 as described below with reference to FIGS. 5A–5D. Some of the advantages with FIG. 4B are briefly noted first. The advantages are described in an example situation in which five bits are resolved.

With reference to FIG. 4A, 32 comparators are typically required in flash ADC 410. In contrast, in FIG. 4B, flash ADC 420 may merely need 16 comparators corresponding to generating 4 bits. In 442 only one bit needs to be resolved, and 2 comparators may be needed. The total number of comparators required in a solution according to FIG. 4B may thus be reduced to (16+2=18) from 32. In addition, the maximum accuracy required of each comparator is also less. (Five bits in 410 as against 4 bits in 420 and 2 bits in 421). The reduction in comparators and less maximum accuracy together results in considerable saving in power consumption.

In addition, the solution of FIG. 4B facilitates implementation ADCs using amplifiers with lower gain. However, the same gain as in FIG. 4A is eventually obtained. In the embodiments described below with reference to amplification circuit 440, the maximum gain attained by an amplifier is 8, implying an amplifier consuming lesser power than in FIG. 4A will suffice. Also the implementations described below allow for higher amplifier gain, which results in better linearity performance, as is well known in the relevant arts. The amplification part of the circuit is described first and the subtraction portion is described then.

5. Amplification

Figure 5A:
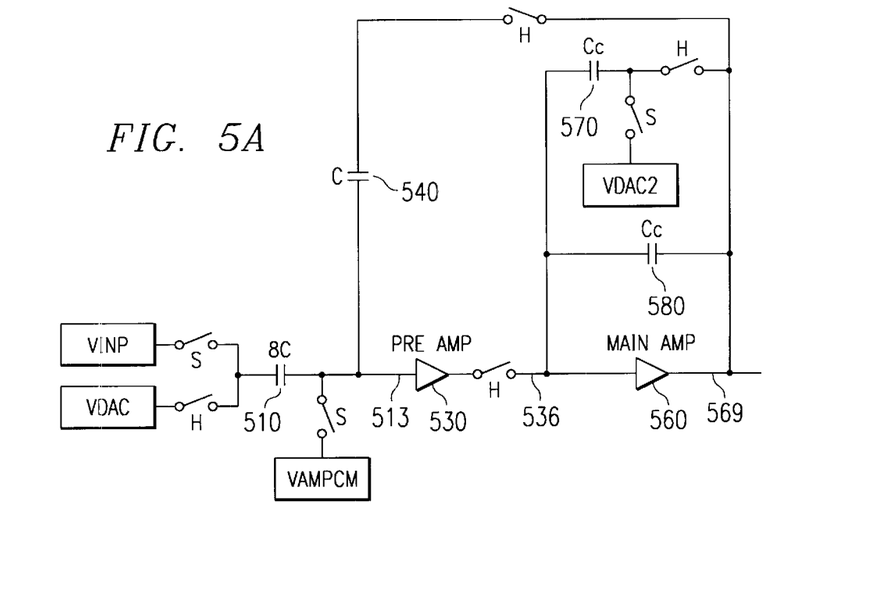
FIG. 5A is a block diagram illustrating the details of a circuit implementing an adder and a amplifier together in an embodiment of the present invention.
Figure 5B:
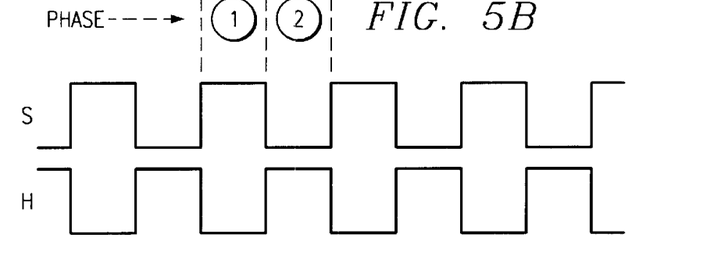
FIG. 5B is a timing diagram illustrating the sample and hold phases of a clock signal in an embodiment of the present invention.
Figure 5C:
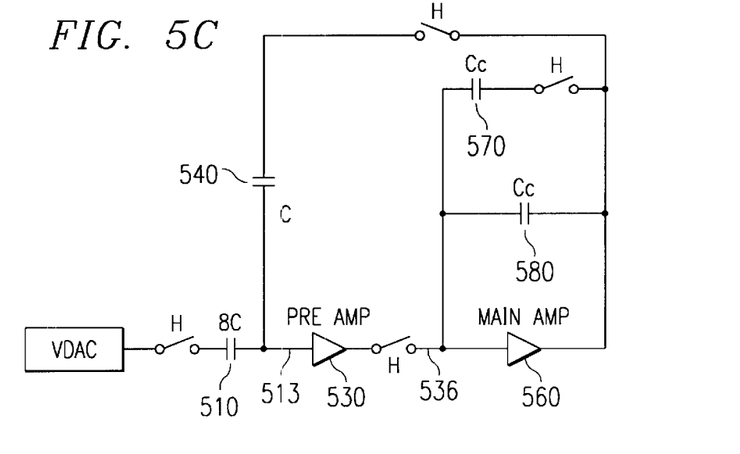
FIG. 5C is a block diagram illustrating the manner in which amplification is attained when the H-switches are closed and S-switches are open.
Figure 5D:
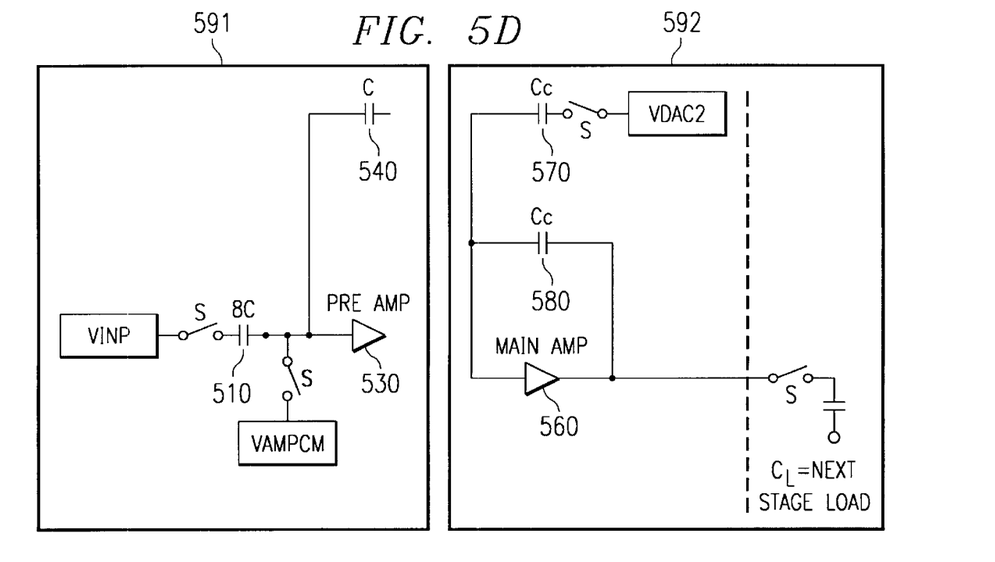
FIG. 5D is a block diagram illustrating the manner in which amplification is attained when the S-switches are closed and H-switches are open.

FIGS. 5A–5D together illustrate the operation of amplification circuit 440 in one embodiment. FIG. 5A is a block diagram depicting the various elements and the configuration, FIG. 5B is a timing diagram used to describe the operation of switches used in amplification circuit 440, FIG. 5C is a block diagram illustrating the operation of amplification circuit 440 as one gain stage, and FIG. 5D is a block diagram illustrating the operation as another gain stage. The two gain stages share an amplifier, and accordingly amplification circuit 440 may also be referred to as an amplifier sharing circuit. Each of the FIGS. 5A–5D is described below in further detail.

Continuing with reference to FIG. 5A, there is shown a Miller Compensated Amplifier containing two amplifiers—pre-amplifier (preliminary amplifier) 530 and main amplifier 560. The output of the pre-amplifier 530 is connected to the input of main amplifier 560 by a second H-switch. In general, switches refer to any components which allow connection in one state and causes de-coupling in another state. In an embodiment, amplification circuit 440 operates using differential signals, in which case a mirror image of the remaining components of FIG. 5A would be present below the two amplifiers. For clarity and conciseness, the elements below are not shown.

Sampling capacitor 510 is coupled to the input analog signal by (via) a first S-switch. The other terminal of sampling capacitor 510 is connected to an input of pre-amp 530. Feedback capacitor 540 is connected between the output of main amplifier 560 (via a first H-switch) and input of pre-amplifier 530. The input of main amplifier 560 is also connected to one terminal of compensation capacitors 570 and 580. The other terminal of compensation capacitor 570 is connected to the output of main amplifier 560 by H-switch. The other terminal of compensation capacitor 580 is connected directly to the output of main amplifier 560.

The operation of amplification circuit 440 is described with reference to FIG. 4B. The H-switches of above are closed (on) during a time duration the signal labeled H is high, and open (off) otherwise. The S-switches are closed during a time duration the signal labeled S is high, and open otherwise. The time durations the S and H switches are respectively high are referred to as S-phase and H-phase. The configuration and operation of amplification circuit 440 during the S and H phases is described below with reference to FIGS. 5C and 5D.

FIG. 5C depicts the status of amplification circuit 440 in the H-phase. Due to the ratio (8) of the capacitances 510 to 540, the output of main amplifier 560 contains a voltage of eight times the voltage on sampling capacitor 510. Assuming main amplifier 560 is implemented of high gain, the inputs of main amplifier 560 are close to each other. Hence, compensation capacitors 570 and 580 are also charged to a substantially equal voltage, i.e., eight times the voltage on sampling capacitor 510. However, a lower gain of main amplifier 560 may not affect the accuracy performance of the circuit in the H-phase.

FIG. 5D depicts the status of amplification circuit 440 in the S-phase. As may be readily observed, the two amplifiers are de-coupled (disconnected) in the S-phase. In addition, compensation capacitor 570 is shown decoupled from the output of main amplifier. As a result of the de-coupling, the amplified signal sampled on compensation capacitor 570 in the previous phase is amplified further. The further amplified signal is provided at the output of main amplifier 560. The voltage across compensation capacitor 580 is amplified by a factor of two as compensation capacitor 570 is connected to a fixed voltage in the S-phase. Thus, sub-block 442 operates as a gain stage to further amplify the input voltage signal by a factor of 2.

It should be understood that there can be more compensation capacitors operated similar to compensation capacitor 570. A correspondingly additional amplification may conveniently be attained as is well known in the relevant arts. Similarly, a designer may eliminate compensation capacitor 580 entirely also. In such a case, an amplification of only one is attained in the second gain stage.

In addition, pre-amplifier 530 despite having a high gain, consumes low power since it does not drive a high load and thus power savings may be achieved. In an embodiment, capacitor 510 has eight times the capacitance of feedback capacitor 540. By proper operation of the S and H switches, an aggregate amplification of 16 may be achieved as described above. Accordingly, the components described above of amplification circuit 440 perform the desired amplification as depicted logically by amplifier 470 of FIG. 4A.

During the sampling of the input signal on sampling capacitor 510, the input signal may be processed in an environment similar top a non-amplifier sharing scheme. This ensures that sampling is as good as in a conventional non-sharing scheme, with minimal degradation due to charge injection or memory or residual effects. Since the main-amplifier inputs are driven by the pre-amplifier outputs, when it is configured as a first gain stage, any residual voltage on the main-amplifier inputs may be effectively removed.

Typically, for amplifier sharing, multiple clock edges are required. In this case, the sampling for the second gain stage may be determined only by opening of the second H-switch, thus ensuring that the sampling for the second gain stage is dependent on only one edge and there is minimal degradation. The approach generally allows a much better performance for the first gain stage, since in its amplifier, the main-amplifier gain is further boosted by the pre-amplifier gain. This can result in much better distortion and linearity performance, as compared to a single stage amplifier scheme.

With respect to subtraction/addition, VDAC and VDAC2 respectively represent the voltages subtracted by adder/subtractors 460 and 461 respectively. The subtraction/addition operation may be performed by implementing the capacitors as multiple capacitor elements in parallel, and by selectively enabling/disabling some of the capacitor elements depending on the degree of desired subtractions. VDAC and VDAC2 may be implemented in a known way. Thus, amplification circuit 440 may be implemented according to the circuit of FIG. 5A as described above.

The description is continued with example implementations of pre-amplifier 530 and main amplifier 560.

6. Main Amplifier

Figure 6:
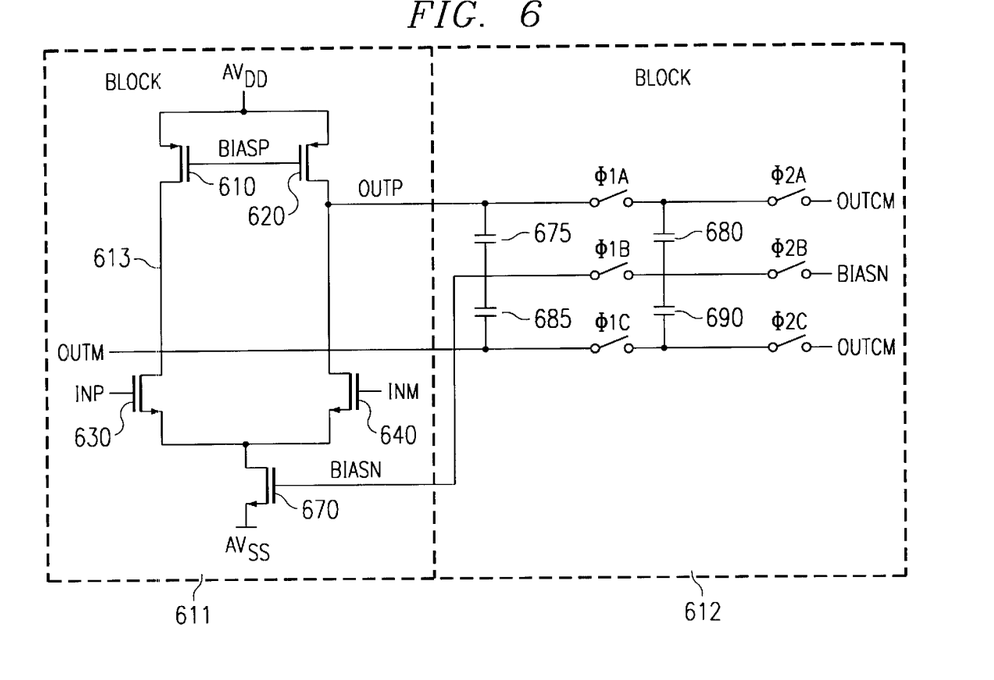
FIG. 6 is a block diagram illustrating an embodiment of an amplifier.

FIG. 6 illustrates the details of main amplifier 560 in one embodiment. Main amplifier 560 is shown containing two blocks 611 and 612. The description of block 612 follows that of block 611. Block 611 is shown containing p-mosFETs 610, 620 driven by voltage source $AV_{DD}$ and n-mosFETs 630, 640 and 670 driven by voltage source $AV_{SS}$. Inputs INP and INM (corresponding to 536 of FIG. 5A) are connected to n-mosFETs 630 and 640 respectively. p-mosFETs 610 and 620 are together biased by a biasing voltage BIASP. BIASN represents the biasing voltage used to bias n-mosFET 670. OUTP and OUTM are the output points (569) of differential amplifier 560.

p-mosFETs 610 and 620 generate the sourcing current and n-mosFET 670 the sinking current. In an embodiment, the sinking current is controlled by changing the bias voltage of the N-MOSFET. The manner in which BIASN signal may be controlled is described with reference to bias control block 612.

Bias control block 612 is shown containing capacitors 675, 685, 680, 690 and switches φ1a, φ1b and φ1c, φ2a, φ2b and φ2c. Capacitors 675 and 685 (one set) are connected in series and so are capacitors 680 and 690 (second set). The common mode feedback circuit compares the average of the output (OUTP and OUTM) with a reference voltage (which is previously set). The error voltage gets added on to BIASN_REF and gets fed to BIASN. This is achieved by closing switches φ2a, φ2b and φ2c in one phase, and φ1a, φ1b and φ1c in the other. By controlling the sinking current and making it equal to the sourcing current, main amplifier 560 is made to operate in its operating region.

In one embodiment, pre-amplifier 530 may be implemented similar to that described with reference to FIG. 6. In such an environment, the common mode voltages of both the amplifiers 560 and 530 may need to be set independently, else an additional feedback loop is typically required. Such requirements may lead to circuit instability and/or complexity, and thus undesirable in several environments. An embodiment of pre-amplifier 530 which addresses the noted considerations is described below.

7. Pre Amplifier

Figure 7:
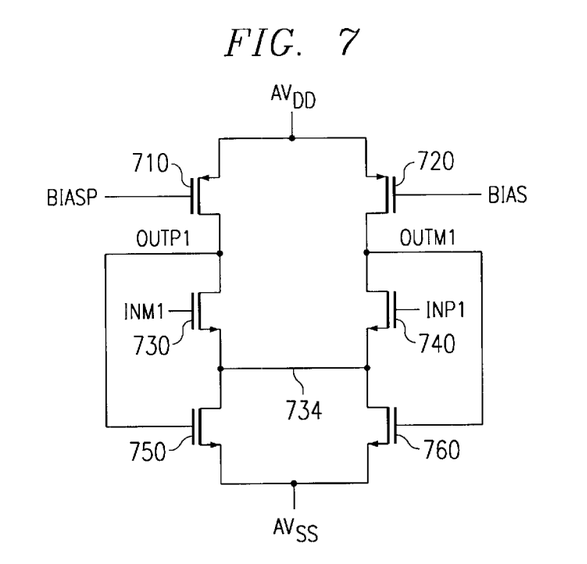
FIG. 7 is a block diagram illustrating the details of a pre-amplifier in an embodiment of the present invention.

FIG. 7 illustrates the circuit details of an embodiment of pre-amplifier 530 containing p-mosFETs 710 and 720, n-mosFETs 730, 740, 750 and 760. Differential inputs INP and INM (513 of FIG. 5A) are connected to the gate terminals of n-mosFETs 730 and 740 respectively. p-mosFETs 710 and 720 are together connected to a biasing voltage BIASP. The source terminals of the two FETs are connected to $AV_{DD}$. The bias circuit of the pre-amplifier 530 may be implemented similar to that of main amp 560. OUTP1 and OUTM1 represents the differential output 536 of the differential amplifier 530 of FIG. 5A. Pre-amplifier 530 is shown implemented as a self biased differential amplifier and together with the main-amplifier forms a two stage miller amplifier.

Operating condition for an amplifier is attained by equalizing the sourcing current and the sinking current. Such equality may be achieved by self biasing pre-amplifier 530. In one embodiment, the gate terminal of n-mosFET 750 is connected to the negative output (OUTM1) of pre-amplifier 530. Similarly, the gate terminal of n-mosFET 760 is connected to the positive output (OUTP1) of pre-amplifier 530, thereby fixing the common mode output voltage ((VOUTP1+VOUTM1)/2). By appropriate design of the circuit components and the elements of the bias circuit, the common mode output voltage for pre-amplifier 530 may be so adjusted that the pre-amplifier is always in its operating range. The design may be performed in a known way.

This common mode voltage may be set equal to the input voltage of main amplifier 560 by appropriate sizing of the transistor 750 and 760. The sizing also may be performed in a known way. Thus the two amplifiers 530 and 560 may be cascaded directly without the use of a coupling capacitor between them. As no additional load is being driven by pre-amplifier 530, power consumption is minimized.

Thus, the present invention provides an amplification circuit which can be used in several embodiments. The amplification circuit is particularly suited for environments in which power consumption is to be minimized. In an embodiment, the amplification circuit is implemented in an analog to digital converter (ADC). An adder/subtractor which is part of the ADC may be conveniently integrated into the amplification by a proper choice of implementation and operation of the capacitors also potentially used for amplification.

While the implementation of the amplification circuit shown has described with reference an ADC, it can be used in a variety of circuits, including but not limited to Programmable gain amplifiers and sample and hold circuits. Similarly, while ADC is described as a component of the AFE in a Camera system, ADC's are the basic blocks in many electronic circuits with applications as wide as communications, wireless applications, motor control, modem, sensors, codecs and many others.

8. Conclusion

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. An integrated circuit processing an input signal, said integrated circuit comprising:

a sampling capacitor receiving said input signal to generate a sampled output;

a first amplifier receiving said sampled output on an input and generating a first amplifier output; and a second amplifier coupled to receive said first amplifier output and amplifying said first amplifier output in a first phase, said second amplifier being disconnected from said first amplifier in a second phase, said second amplifier amplifying said first amplifier output to generate a desired amplified signal.

2. The integrated circuit of claim 1, further comprising a first capacitor coupled in parallel across said second amplifier to operate as a compensation capacitor in said first phase, said first capacitor being decoupled from the output of said second amplifier in said second phase, wherein said first amplifier output is sampled on said first capacitor in said first phase and amplified in said second phase.

3. The integrated circuit of claim 2, further comprising:
a feedback capacitor coupled between an output of said second amplifier and an input of said first amplifier;
a first H-switch connecting said feedback capacitor to said output during said first phase and disconnecting said feedback capacitor from said output during said second phase.

4. The integrated circuit of claim 3, further comprising a second compensation capacitor coupled in parallel to said second amplifier in both said first phase and said second phase.

5. The integrated circuit of claim 4, further comprising:
a first S-switch connecting said input signal to said sampling capacitor during said second phase and disconnecting said input signal from said sampling capacitor during said first phase;
a second H-switch connecting said first amplifier to said second amplifier during said first phase and disconnecting said first amplifier from said second amplifier during said second phase.

6. The integrated circuit of claim 5, wherein said first amplifier output represents said input signal amplified by a first amplification factor, wherein said first amplification factor is determined by the ratio of the capacitance said feedback capacitor and said sampling capacitor.

7. The integrated circuit of claim 6, wherein said first amplification factor equals 8.

8. The integrated circuit of claim 6, wherein the capacitance of said first capacitor equals the capacitance of said second compensation capacitor such that said input signal is further amplified by a factor of 2 in said second phase.

9. The integrated circuit of claim 6, wherein said first amplifier and said second amplifier are comprised in a Miller Compensated Amplifier.

10. The integrated circuit of claim 6, wherein said input signal is received as a differential signal.

11. The integrated circuit of claim 10, wherein said first amplifier is self-biased allowing said first amplifier to be cascaded with said second amplifier without intermediate capacitors.

12. The integrated circuit of claim 11, wherein said first amplifier comprises:
a first FET and a second FET, the source terminals of said first FET and said second FET being connected to a voltage source $AV_{DD}$, the gate terminals of said first FET and said second FET being biased by a common signal;
a third FET and a fourth FET, the source terminal of said third FET being connected to the drain terminal of said fourth FET, the drain terminal of said third FET being connected to the drain terminal of said first FET, and the source terminal of said fourth FET being grounded;
a fifth FET and a sixth FET, the source terminal of said fifth FET being connected to the drain terminal of said sixth FET, the sixth FET being self-biased, the drain terminal of said fifth FET being connected to the drain terminal of said second FET, and the source terminal of said sixth FET being grounded.

13. The integrated circuit of claim 12, wherein the drain terminal of said third FET is connected to the gate terminal of said fourth FET to self-bias said third FET, and wherein said FET comprises a mosFET.

14. The integrated circuit of claim 6, wherein a first voltage level is subtracted from said sampling capacitor and a second voltage level is subtracted from said first capacitor, wherein said first value and said value are determined according to values received from respective flash analog to digital converter (ADC), wherein said integrated circuit is provided in an ADC.

15. A block used in an analog to digital converter (ADC), said block for resolving a plurality of bits representing a voltage level of an input signal, said block further generating an amplified residue signal provided as an input to any subsequent block contained within said ADC, wherein a residue signal represents an unresolved analog component of said input signal and said amplified residue signal is generated by amplifying said residue signal, said block comprising:
a first flash ADC receiving said input signal and a reference voltage, said first flash ADC generating a first value representing a first subset of said plurality of bits;
a second flash ADC receiving an intermediate signal and generating a second value representing a second subset of said plurality of bits;
an amplifier sharing circuit operating as a first gain stage and a second gain stage, said first gain stage generating a first residue signal using said first value and a second residue signal using said second value, said amplifier sharing circuit comprising:
a sampling capacitor receiving said input signal to generate a sampled output;
a first amplifier receiving said sampled output on an input and generating a first amplifier output; and
a second amplifier coupled to receive said first amplifier output and amplifying said first amplifier output in a first phase to operates as said first gain stage,
said second amplifier being disconnected from said first amplifier in a second phase, said second amplifier amplifying said first amplifier output to generate a desired amplified signal to operate as said second gain stage.

16. The block of claim 15, further comprising a first capacitor coupled in parallel across said second amplifier to operate as a compensation capacitor in said first phase, said first capacitor being decoupled from the output of said second amplifier in said second phase, wherein said first amplifier output is sampled on said first capacitor in said first phase and amplified in said second phase.

17. The block of claim 16, wherein a first voltage level is subtracted from said sampling capacitor and a second voltage level is subtracted from said another sampling capacitor, wherein said first voltage level and said second voltage level are respectively determined based on said first value and said second value.

18. The block of claim 17, further comprising:
a feedback capacitor coupled between an output of said second amplifier and an input of said first amplifier;
a first H-switch connecting said feedback capacitor to said output during said first phase and disconnecting said feedback capacitor from said output during said second phase.

19. The block of claim 17, further comprising a second compensation capacitor coupled in parallel to said second amplifier in both said first phase and said second phase.

20. The block of claim 18, further comprising:
    a first S-switch connecting said input signal to said sampling capacitor during said second phase and disconnecting said input signal from said sampling capacitor during said first phase;
    a second H-switch connecting said first amplifier to said second amplifier during said first phase and disconnecting said first amplifier from said second amplifier during said second phase.

21. The block of claim 19, wherein said first amplifier output represents said input signal amplified by a first amplification factor, wherein said first amplification factor is determined by the ratio of the capacitance said feedback capacitor and said sampling capacitor.

22. The block of claim 20, wherein said first amplification factor equals 8.

23. The block of claim 20, wherein the capacitance of said first capacitor equals the capacitance of said second compensation capacitor such that said input signal is further amplified a factor of 2 in said second phase.

24. The block of claim 20, wherein said first amplifier and said second amplifier are comprised in a Miller Compensated Amplifier.

25. The block of claim 20, wherein said input signal is received as a differential signal.

26. The block of claim 24, wherein said first amplifier is self-biased allowing said first amplifier to be cascaded with said second amplifier without intermediate capacitors.

27. The block of claim 25, wherein said first amplifier comprises:
    a first FET and a second FET, the source terminals of said first FET and said second FET being connected to a voltage source $AV_{DD}$, the gate terminals of said first FET and said second FET being biased by a common signal;
    a third FET and a fourth FET, the source terminal of said third FET being connected to the drain terminal of said fourth FET, the drain terminal of said third FET being connected to the drain terminal of said first FET, and the source terminal of said fourth FET being grounded;
    a fifth FET and a sixth FET, the source terminal of said fifth FET being connected to the drain terminal of said sixth FET, the fifth FET being self-biased, the drain terminal of said fifth FET being connected to the drain terminal of said second FET, and the source terminal of said sixth FET being grounded.

28. The block of claim 26, wherein the drain terminal of said third FET is connected to the gate terminal of said fourth FET to self-bias said third FET, and wherein said FET comprises a mosFET.

29. The block of claim 28, wherein said input signal comprises an analog voltage signal.

30. A system processing an input signal, said system comprising:
    sampling means for sampling said input signal to generate a sampled voltage signal;
    first amplifying means amplifying said sampled voltage signal, said first amplifying means including a pre-amplifier and a main amplifier, wherein an output of said pre-amplifier is connected to an input of said main amplifier to generate a first amplified output;
    disconnecting means for disconnecting said main amplifier from said pre-amplifier; and
    second amplifying means for further amplifying said first amplifier output, said second amplifying means including said main amplifier to generate a desired amplified signal.

31. The system of claim 30, further comprising:
    means for using a first capacitor as a compensation capacitor across said main amplifier when said first amplifying means amplifies said sampled voltage signal; and
    means for disconnecting said first capacitor from the output of said main amplifier when said second amplifying means further amplifies said first amplifier output.

32. The system of claim 31, further comprising an analog to digital converter (ADC).

33. A method of amplifying an input signal, said method comprising:
    sampling said input signal on a sampling capacitor to generate a sampled voltage signal;
    amplifying said sampled voltage signal using a pre-amplifier and a main amplifier, wherein an output of said pre-amplifier is connected to an input of said main amplifier to generate a first amplified output;
    disconnecting said main amplifier from said pre-amplifier; and
    further amplifying said first amplifier output using said main amplifier when said main amplifier is disconnected from said pre-amplifier to generate a desired amplified signal.

34. The method of claim 33, further comprising:
    using a first capacitor as a compensation capacitor across said main amplifier during said amplifying, wherein said first amplified output is sampled on said first capacitor during said amplifying; and
    disconnecting said first capacitor from the output of said main amplifier, whereby said first capacitor provides said first amplified output as an input to said main amplifier during said further amplifying.

* * * * *